United States Patent [19]

Tremont et al.

[11] Patent Number: 4,749,640
[45] Date of Patent: Jun. 7, 1988

[54] INTEGRATED CIRCUIT MANUFACTURING PROCESS

[75] Inventors: Peter L. Tremont, Spring, Tex.; Arthur J. Ackermann, Kirkwood, Mo.

[73] Assignees: Monsanto Company, St. Louis, Mo.; Arrowhead Industrial Water, Inc., Lincolnshire, Ill.

[21] Appl. No.: 903,022

[22] Filed: Sep. 2, 1986

[51] Int. Cl.⁴ .............................................. G03C 5/00
[52] U.S. Cl. ................................... 430/314; 430/316; 430/317; 430/325; 430/326; 430/394; 437/946
[58] Field of Search ............... 430/313, 317, 325, 326, 430/329, 316, 314, 394; 437/939, 946

[56] References Cited

U.S. PATENT DOCUMENTS

| | | |
|---|---|---|
| 3,066,050 | 11/1962 | Garton, Jr. |
| 3,705,055 | 12/1972 | Christensen et al. ............ 430/330 X |
| 3,890,176 | 6/1975 | Bolon .................... 156/646 |
| 4,129,457 | 12/1978 | Basi . |
| 4,156,619 | 5/1979 | Griesshammer . |
| 4,318,749 | 3/1982 | Mayer . |
| 4,341,592 | 7/1982 | Shortes et al. ...................... 156/643 |
| 4,409,183 | 10/1983 | Fischer . |
| 4,443,295 | 4/1984 | Radigan et al. . |
| 4,595,498 | 6/1986 | Cohen et al. . |

OTHER PUBLICATIONS

Legan, "Ultraviolet Light Takes on CPI Role," *Chemical Engineering*, Jan. 25, 1982.
Nezgod, "Purification of Deionized Water by Oxidation with Ozone," *Solid State Technology*, Oct. 1984.
Nebel, "Purification of Deionized Water by Oxidation with Ozone," (undated).
Craven, et al., unpublished document entitled "High Purity Water Technology for Silicon Wafer Cleaning in VLSI Production," speech delivered in May, 1986.
Nebel et al., "Purification of D.I. Water with Ozone", Solid State Technology, Oct. 1984, pp. 185–193.
Oldam, W. G., "The Fabrication of Microelectronic Circuits," Scientific American, Sep. 1977, vol. 237(3), p. 110.

*Primary Examiner*—John E. Kittle
*Assistant Examiner*—José G. Dees
*Attorney, Agent, or Firm*—George H. Gerstman

[57] ABSTRACT

A process is disclosed for manufacturing an integrated circuit in which multiple patterned layers of thin film materials are provided on a silicon wafer. The wafer is conditioned between the providing of layers, after each etching step, by rinsing the item with a purified water solution containing at least 0.01 ppm ozone, preferably between 0.02 and 0.09 ppm ozone.

12 Claims, 2 Drawing Sheets

INTEGRATED CIRCUIT MANUFACTURING PROCESS

FIELD OF THE INVENTION

The present invention concerns a novel process used in the manufacturing of integrated circuits and semiconductor materials, and, more particularly, a novel conditioning process intended to provide a greater yield.

BACKGROUND OF THE INVENTION

In the production of integrated circuits such as VLSI circuits, it is essential that the materials and the circuit being constructed be free from contamination. The numerous steps that are required in producing the silicon wafer and fabricating the circuit render contamination inevitable unless significant precautions and procedures are utilized.

In the art of manufacturing the silicon wafers, the silicon crystal is first grown. The crystal is cropped for specification, and then ground into a cylinder. The cylinder is sliced into thin slices (i.e., wafers), with the thickness of the slices being dependent upon the diameter of the cylinder. The slices are then lapped flat, etch ground and contoured, and then initially cleaned. They are then etched for smoothness and to remove damage, thereafter cleaned again, then polished, and then etched and cleaned. In the latter cleaning process, a hydrogen peroxide solution is used to provide a thin oxide coating (e.g., about 25 to 30 angstroms) and the item is rinsed with a purified water solution. Thereafter, the wafers are packaged in a sterile manner and shipped for circuit fabrication.

Circuit fabrication is a complex process which requires numerous steps in which thin film materials are layered on the silicon wafer. During the fabrication process, bare portions of the silicon wafer surface may become exposed. These exposed areas become critical functioning parts of the circuit and if the bare silicon is contaminated in any manner, there may be a subsequent circuit failure which cannot be detected until the circuit is tested. For example, not only is there a critical interface between the bare silicon and a subsequent oxide layer thereon, but there is also a critical interface between the silicon oxide and a polysilicon coating; between the polysilicon coating and the silicide or metallic coating; and many other interfaces. It is essential that the bare silicon and the interfaces be free from contaminants.

Some contamination has more negative effects on the functionality of the circuit elements than other contamination. In general, the impact can be defined as either lithographically blocking or chemically contaminating. Particles which are approximately 10 percent to 30 percent of the minimum feature size and optically opaque may significantly alter the functional performance of the circuit element because they alter the lithographic reproduction process. Even smaller particles reduce yield if they chemically alter the silicon near the front surface, or the composition of the films being deposited on the silicon wafer. The greatest problems involve degradation of the quality of the oxide used for gate elements or the polysilicon deposition used for the gate plates or contacts. These contamination problems may not cause immediate functional failure and loss of die yield, but may show up as oxide or contact reliability problems after the die is shipped to the customer.

Typically, deionized water is used to clean the wafer during the fabrication of the circuit, including cleaning the bare silicon, and cleaning the material interfaces during the fabrication of the device.

The silicon wafer and the entire integrated circuit process is oxide compatible. It is, therefore, an object of the invention to condition the silicon wafer during fabrication of the integrated circuit, in a manner so that it has the cleanest possible oxide layer on the bare silicon and so that it is most receptive to the next layer to be applied.

Another object of the present invention is to provide a process for manufacturing integrated circuits in which the wafer is conditioned during critical interfaces, to minimize problems at the interfaces and produce a better yield.

Other objects of the present invention will become apparent as the description proceeds.

SUMMARY OF THE INVENTION

We have discovered that in fabricating the integrated circuit on the wafer, it is beneficial to condition the wafer by rinsing it with purified water containing at least 0.01 ppm ozone to clean the bare surface of the silicon and between various interfaces of the circuit construction. We have found that such conditioning minimizes contamination by minimizing the adhesion of organics, and minimizes the adhesion of particulates including bacterial particles.

A process is provided in accordance with the present invention, for manufacturing an integrated circuit in which there are multiple patterned layers of thin film materials on a semiconductor wafer, including the steps of providing a material layer overlying the semiconductor wafer surface; providing a photoresist layer over the material layer; exposing the photoresist to change its characteristics; removing portions of the photoresist to provide uncovered portions of the material layer; removing the uncovered portions of the material layer; and thereafter conditioning the item by rinsing with a purified water solution containing at least 0.01 ppm ozone.

In the illustrative embodiment, between the steps of removing portions of the photoresist and removing the uncovered portions of the material layer, the item is also conditioned with a purified water solution containing at least 0.01 ppm ozone.

In the illustrative embodiment, the purified water solution preferably contains between 0.02 and 0.09 ppm ozone. The semiconductor wafer material is silicon, although the process may also be applicable to fabricating an integrated circuit on gallium arsenide.

A more detailed explanation of the invention is provided in the following description and claims, and is illustrated in the accompanying drawings.

DETAILED DESCRIPTION OF THE ILLUSTRATIVE EMBODIMENT

Figure 1:
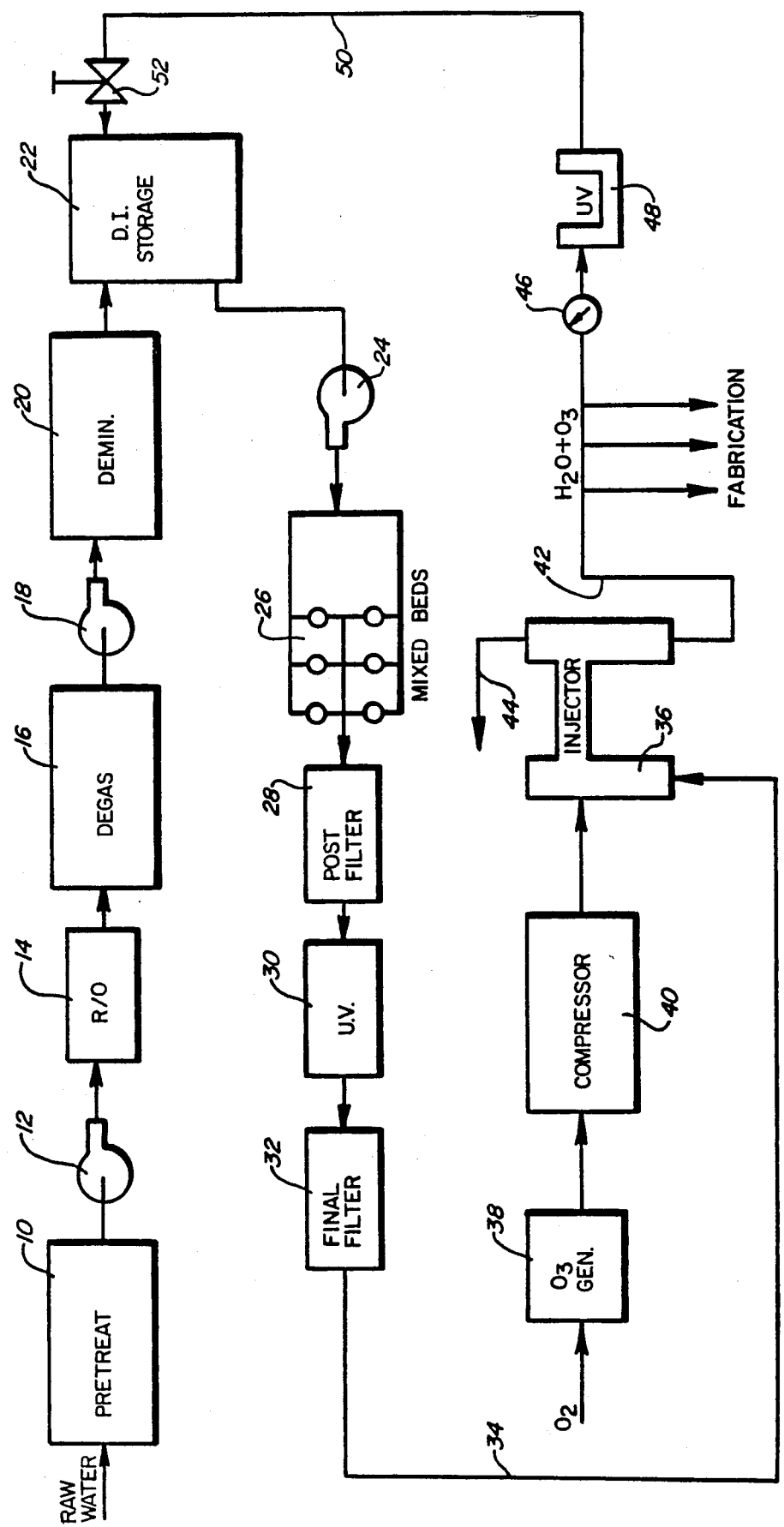
FIG. 1 is a block diagram of a water treatment process constructed in accordance with the present invention, used in providing ozonized water for fabricating integrated circuits on silicon wafers.

In accordance with the present invention, ozonated and deionized purified water is used for conditioning the wafer during circuit fabrication, to clean the bare surface of the silicon and between various interfaces of the circuit construction. FIG. 1 shows a system for providing the ozonated, deionized purified water. Referring to FIG. 1, raw water is pretreated using multimedia filters and some chemical injection in pretreatment stage 10 and is then pumped via pump 12 to a reverse osmosis module 14 from where (if required) it is degasified by degasifier 16 and pumped by repressurization pump 18 to a demineralization stage 20 which comprises a cation, anion and mixed bed, or mixed bed alone.

As a substitute for the reverse osmosis module, degasification stage 16, repressurization pump 18 and demineralizer 20, which comprises a cation, anion and mixed bed, or mixed bed alone, a double pass reverse osmosis system can be utilized as disclosed in Pittner U.S. Pat. No. 4,574,049.

Demineralized water goes to deionized water storage tank 22. It is repressurized by means of pump 24 and fed to polishing deionized exchange bottles 26 which comprise mixed beds (typically a combination of cation and anion resins). The deionized water from mixed beds 26 are filtered via postfilter 28 and then processed through ultraviolet lamps 30 for bacteria control and then through submicron filtration 32. The postfilters are used as resin traps. The deionized purified water is fed via conduit 34 to a static gas injector 36.

The deionized purified water is ozonated as follows. Pure oxygen gas is fed through a conventional ozone generator 38 which produces oxygen plus ozone at about 10 psi. The oxygen and ozone at about 10 psi is fed to a compressor 40 where the gas is compressed to 85 psi and then fed to static gas injector 36. The compressed oxygen and ozone will mix with the purified water in the static gas injector 36 to form ozonated water and provide the ozonated water on conduit 42. A bleed line 44 is provided to remove the bubbles from the ozonated water line.

The deionized, ozonated, purified water in conduit 42 is fed to the circuit fabrication area, via PVDF plumbing. A dissolved ozone meter 46 is provided to monitor the ozone concentration. We have discovered that the ozone concentration in the deionized purified water is preferably between 0.01 and 0.1 parts per million in order for the wafer during circuit fabrication to be conditioned properly and to prevent significant damage to the system hardware. We have discovered that it is most desirable for the ozone concentration to be between 0.02 and 0.09 ppm.

The deionized, ozonated, purified water is recycled but the ozone must be removed prior to return of the water to deionized storage tank 22. To this end, the ozonated water is processed through ultraviolet lamps 48 for removal of the ozone for recycling. The deionized purified water, with the ozone removed, is then fed via conduit 50 through a back pressure regulator 52 to the deionized water storage tank 22.

Figure 2A:
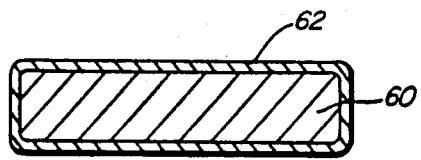
FIGS. 2A-2N comprise cross-sectional diagrammatic views of the silicon wafer during circuit fabrication.
Figure 2H:
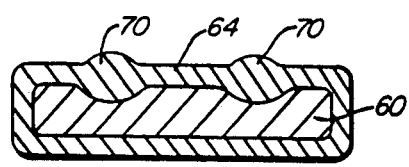
Figure 2B:
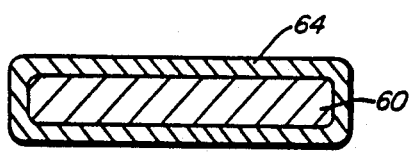
Figure 2I:
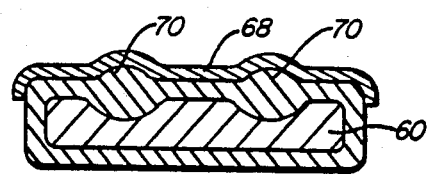
Figure 2C:
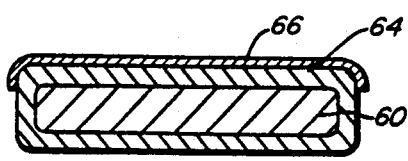
Figure 2J:
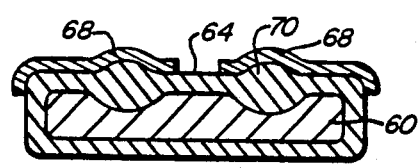
Figure 2D:
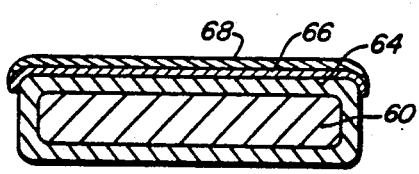
Figure 2K:
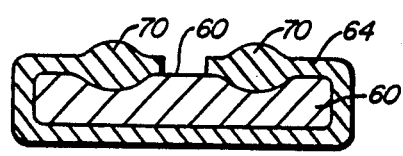
Figure 2E:
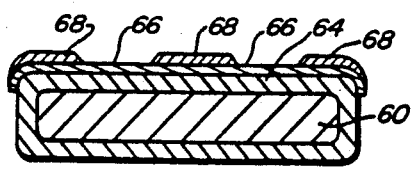
Figure 2L:
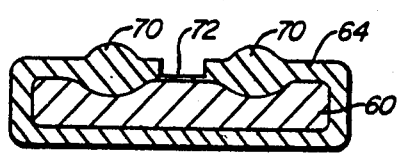
Figure 2F:
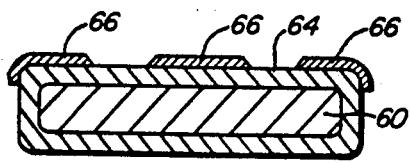
Figure 2M:
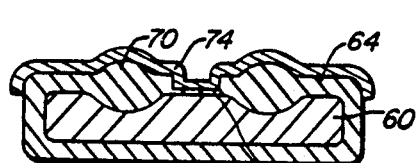
Figure 2G:
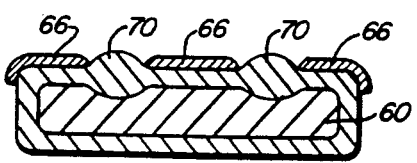
Figure 2N:
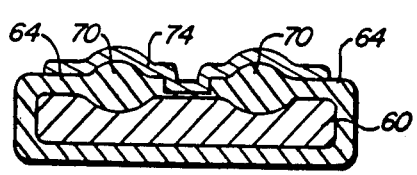

FIGS. 2A-2N show a portion of the fabrication of the integrated circuit after a clean silicon wafer has been received. FIG. 2A illustrates the silicon wafer as it may be received from a wafer manufacturer with the silicon wafer 60 being coated with an oxide 62 that is chemically grown or from the previous hydrogen peroxide treatment, with the oxide typically having a thickness of 20 to 30 angstroms. Often the circuit fabricator will remove the oxide to reclean the silicon. On the other hand, the oxide layered silicon of FIG. 2A may be placed in a furnace where it is oxygenated to provide a thermally grown oxide 64 (FIG. 2B) having a thickness between 100 angstroms and 400 angstroms. Thereafter, a silicon nitride overlayer 66 (FIG. 2C) is provided in a furnace and a photoresist layer 68 is placed over the silicon nitride layer 66.

The photoresist 68 is illuminated and then etched (see FIG. 2E) to leave uncovered portions of the silicon nitride. The item of FIG. 2E is then conditioned by rinsing it with the deionized purified water containing between 0.01 and 0.1 ppm ozone, preferably between 0.02 and 0.09 ppm ozone.

After such rinsing, the portions of the silicon nitride 66 that are no longer covered with photoresist 68 are etched to result in the item illustrated in FIG. 2F, in which the photoresist has been removed and portions of the oxide 64 are exposed. The item is again is conditioned by rinsing it with the ozonated water. Thereafter the item is placed in a furnace to provide a thick film oxide 70, approximately 2,000 angstroms thick, which grows where the nitride has been removed. This is illustrated in FIG. 2G. Thereafter, the item is conditioned by rinsing it with the ozonated water and the silicon nitride 66 is removed (see FIG. 2H). The item is again rinsed with the ozonated water and thereafter a photoresist 68 is added (FIG. 2I), illuminated and thereafter etched (FIG. 2J). As illustrated in FIG. 2J, this leaves bare portions of the oxide, and the item is again conditioned by rinsing with the ozonated water. As illustrated in FIG. 2K, the photoresist is removed and the oxide is etched down to bare silicon in various areas of the silicon surface. Thereafter, as illustrated in FIG. 2L, a gate oxide 72 is thermally grown, with the gate oxide having a close tolerance thickness within the range of 150 angstroms to 300 angstroms. The gate oxide is typically the most critical oxidation in the entire fabrication of the integrated circuit. It is absolutely essential that the bare silicon be properly conditioned for the growing of the gate. To this end, the ozonated water rinse treats and conditions the bare silicon and provides a thin oxide layer of perhaps a few monolayers for receiving the gate oxide.

After the gate is grown as illustrated in FIG. 2L, referring to FIG. 2M a layer 74 of polysilicon is deposited. After the polysilicon is deposited, another photoresist layer 68 is provided which is illuminated, etched, rinsed with ozonated water, and then the uncovered polysilicon layer is etched and rinsed with the ozonated water, to result in the item illustrated in FIG. 2N.

There are many other layering steps which occur during the fabrication of the circuit. In accordance with the present invention, there will typically be provided a layer of photoresist, which will be illuminated, etched, the residual will be rinsed with ozonated water, then the material that is not underlying the photoresist will be etched and thereafter rinsed with the ozonated water.

Although it is desirable that the ozonated water be used for rinsing when the photoresist layer has been removed, it is most essential that the conditioning with the ozonated water occur after the material which is no longer covered with photoresist has been etched. Thus, prior to providing an overlayer of material, it is most essential that the conditioning step be performed by rinsing with deionized, purified water containing 0.01 to 0.1 ppm ozone, preferably 0.02 to 0.09 ppm ozone.

We have found that the conditioning by ozonated water as just described enhances the circuit fabrication process by enabling a controlled oxidation of the interface with an ultrapure reagent. Contamination is minimized by minimizing the adhesion of organics and particulates including bacterial particles. There are minimal particulates because a very clean gas is being injected into ultrapure water. The purity of the ozone that is injected in the water is much higher than the purity of chemicals that are found in the circuit fabrication line in prior art processing systems.

Although an illustrative embodiment has been shown and described, it is to be understood that various modifications and substitutions may be made by those skilled in the art without departing from the spirit and scope of the present invention.

What is claimed is:

1. A process for manufacturing an integrated circuit in which there are multiple patterned layers of thin film materials on a semiconductor wafer, including the steps of:
   providing a material layer overlying the semiconductor wafer surface;
   providing a photoresist layer over the material layer;
   exposing the photoresist to change its characteristics;
   removing portions of the photoresist to provide uncovered portions of the material layer;
   removing the uncovered portions of the material layer; and
   thereafter conditioning the wafer surface to provide a thin oxide layer thereon by rinsing it with a purified water solution containing at least 0.01 ppm ozone.

2. A process as described in claim 1, wherein between the steps of removing portions of the photoresist and removing the uncovered portions of the material layer, there is a step of conditioning the item by rinsing it with a purified water solution containing at least 0.01 ppm ozone.

3. A process as described in claim 1, wherein said purified water solution contains between 0.02 and 0.09 ppm ozone.

4. A process as described in claim 1, in which said material layer has a thickness of between 20 and 400 angstroms.

5. A process as described in claim 1, wherein said material layer comprises silicon nitride.

6. A process as described in claim 1, wherein said material layer comprises a thick film oxide.

7. A process as described in claim 1, in which the semiconductor material is silicon and wherein when the uncovered portion of the material layer is removed, bare silicon is exposed prior to the conditioning step, whereby the bare silicon is conditioned to provide a thin oxide layer thereon by rinsing it with said purified water containing ozone.

8. A process as described in claim 1, including the following steps after the conditioning step:
   providing a second material layer over the conditioned item;
   providing a photoresist layer over the second material layer;
   exposing the photoresist to change its characteristics;
   removing portions of the photoresist to provide uncovered portions of the second material layer;
   removing the uncovered portions of the second material layer; and
   thereafter conditioning the item by rinsing it with a purified water solution containing at least 0.01 ppm ozone.

9. A process for manufacturing an integrated circuit in which there are multiple patterned layers of thin film materials on a silicon wafer, including the steps of:
   providing a material layer overlying the silicon wafer surface;
   providing a photoresist layer over the material layer;
   exposing the photoresist to change its characteristics;
   removing portions of the photoresist to provide uncovered portions of the material layer;
   thereafter conditioning the item by rinsing it with a purified water solution containing between 0.02 and 0.09 ppm ozone;
   thereafter removing the uncovered portions of the material layer, to expose bare silicon;
   thereafter conditioning the bare silicon to provide a thin oxide layer thereon by rinsing it with a purified water solution containing between 0.02 and 0.09 ppm ozone.

10. A process as described in claim 9, including the following steps after the step of conditioning the bare silicon:
    providing a second material layer over the conditioned item;
    providing a photoresist layer over the second material layer;
    exposing the photoresist to change its characteristics;
    removing portions of the photoresist to provide uncovered portions of the second material layer;
    removing the uncovered portions of the second material layer; and
    thereafter conditioning the item by rinsing it with a purified water solution containing between 0.02 and 0.09 ppm ozone.

11. A process for manufacturing an integrated circuit in which there are multiple patterned layers of thin film materials on a semiconductor wafer, including the steps of:
    applying layers of materials over the semiconductor wafer surface; applying a photoresist layer;
    removing selected portions of the photoresist layer;
    removing portions of the materials from the wafer surface between the material applying steps;
    prior to a material applying step, conditioning the wafer surface to provide a thin oxide layer thereon by rinsing it with a purified water solution containing at least 0.01 ppm ozone.

12. A process as described in claim 11, wherein said purified water solution contains between 0.02 and 0.09 ppm ozone.

* * * * *